(12) United States Patent
Uchida et al.

(10) Patent No.: US 8,217,256 B2
(45) Date of Patent: Jul. 10, 2012

(54) THERMOELECTRIC MATERIAL, METHOD FOR PRODUCING THE SAME, AND THERMOELECTRIC CONVERTER

(75) Inventors: Yoshio Uchida, Ibaraki (JP); Tetsuro Tohma, Ehime (JP); Kazuo Sadaoka, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 546 days.

(21) Appl. No.: 12/438,173

(22) PCT Filed: Aug. 13, 2007

(86) PCT No.: PCT/JP2007/066062
§ 371 (c)(1),
(2), (4) Date: Feb. 20, 2009

(87) PCT Pub. No.: WO2008/023650
PCT Pub. Date: Feb. 28, 2008

(65) Prior Publication Data
US 2010/0175735 A1    Jul. 15, 2010

(30) Foreign Application Priority Data

Aug. 24, 2006 (JP) ................................. 2006-227483
Apr. 12, 2007 (JP) ................................. 2007-104644

(51) Int. Cl.
*H01L 35/14* (2006.01)
(52) U.S. Cl. ........................................................ 136/239
(58) Field of Classification Search .................. 136/239, 136/240
See application file for complete search history.

(56) References Cited

U.S. PATENT DOCUMENTS

| 3,601,887 | A  | * | 8/1971 | Mitchell et al. ................. 438/55 |
| 6,524,750 | B1 |   | 2/2003 | Mansuetto |
| 2003/0078170 | A1 | * | 4/2003 | Brown .......................... 508/115 |
| 2005/0217715 | A1 | * | 10/2005 | Sakurada et al. .......... 136/236.1 |
| 2006/0159950 | A1 |   | 7/2006 | Kunisada et al. |
| 2007/0157961 | A1 |   | 7/2007 | Uchida et al. |

FOREIGN PATENT DOCUMENTS

| JP | 2005-276959 A | 10/2005 |
| JP | 2006-062951 A | 3/2006 |
| JP | 2006-100683 A | 4/2006 |
| JP | 2006-256889 A | 9/2006 |
| WO | 2006011581 A1 | 2/2006 |

OTHER PUBLICATIONS

Zaitsev, Moon, Takagi and Awano, Preparation and characterization of nanocrystalline doped TiO2, 2000, Advanced Powder Technol., 11, 2, 211-220.*

(Continued)

*Primary Examiner* — Jennifer Michener
*Assistant Examiner* — Miriam Berdichevsky
(74) *Attorney, Agent, or Firm* — Sughrue Mion, PLLC

(57) ABSTRACT

The present invention provides a thermoelectric material useful for a thermoelectric converter having excellent energy conversion efficiency, and a method for producing the thermoelectric material. The thermoelectric material comprising an oxide containing Ti, M, and O and the oxide is represented by Formula (1).

$$Ti_{1-x}M_xO_y \qquad (1)$$

M represents at least one selected from the group consisting of V, Nb, and Ta, x is not less than 0.05 and not more than 0.5, and y is not less than 1.90 and not more than 2.02.

5 Claims, 7 Drawing Sheets

OTHER PUBLICATIONS

F. Lagnel et al., "Electron Transport in Amorphous (Ti, Nb)O2 Solid Solutions", Phys. Stat. Sol. (b), vol. 151, 1989, pp. 531-543 (XP008120082).

M.A. Tena et al., "Synthesis of Gray Ceramic Pigments with Rutile Structure from Alkoxides", Journal of Sol-Gel Science and Technology, vol. 26, 2003, pp. 813-816 (XP008135623).

Yun Lu et al, "Thermoelectric Properties of Non-Stoichiometric Titanium Dioxide $TiO_{2-x}$ Fabricated by Reduction Treatment Using Carbon Powder", Materials Transactions, vol. 47, No. 6, pp. 1449-1452, 2006.

M. Itakura et al., "Hall Effect and Thermoelectric Power in Semiconductive TiO2", Japanese Journal of Applied Physics, vol. 6, No. 3, Mar. 1967, pp. 311-317.

* cited by examiner

THERMOELECTRIC MATERIAL, METHOD FOR PRODUCING THE SAME, AND THERMOELECTRIC CONVERTER

TECHNICAL FIELD

The present invention relates to a thermoelectric material, a method for producing the same, and a thermoelectric converter.

BACKGROUND ART

Thermoelectric conversion power generation is electric power generation by converting thermal energy into electric energy by using a phenomenon in which a voltage (thermoelectromotive force) is generated when a temperature difference is provided in a thermoelectric material, i.e., the Seebeck effect. Since the thermoelectric conversion power generation is capable of utilizing various waste heats such as geothermal heat, heat from an incinerator, and the like as heat sources, it is expected to be the electric power generation which is commercially practical and environment-friendly.

Energy conversion efficiency of the thermoelectric material is dependant on figure of merit (Z) of the thermoelectric material. The figure of merit (Z) is a value determined using Seebeck coefficient ($\alpha$), electric conductivity ($\sigma$), and thermal conductivity ($\kappa$) by Equation (1):

$$Z = \alpha^2 \times \sigma / \kappa \qquad (1)$$

and, as the figure of merit of the thermoelectric material is higher, a thermoelectric converter obtained therefrom has higher energy conversion efficiency. In particular, $\alpha^2 \times \sigma$ in Equation (1) is called output factor and, as the thermoelectric material has higher output factor, the thermoelectric converter obtained therefrom has higher output per unit temperature.

The thermoelectric material includes a p-type thermoelectric material having positive Seebeck coefficient, and an n-type thermoelectric material having negative Seebeck coefficient. Typically, the thermoelectric converter in which the p-type thermoelectric material and the n-type thermoelectric material are electrically connected in series is used in the thermoelectric conversion power generation. Thus, the energy conversion efficiency of the thermoelectric converter is dependent on the figure of merit of each of the p-type thermoelectric material and the n-type thermoelectric material. In order to obtain the thermoelectric converter having excellent energy conversion efficiency, the p-type thermoelectric material and the n-type thermoelectric material each having high figure of merit are required.

As the n-type thermoelectric material, there is known a thermoelectric material obtained by mixing, molding, and sintering titanium oxide and tantalum oxide (or titanium oxide and niobium oxide) in air (JP-A-2005-276959).

However, the n-type thermoelectric material disclosed in the publication does not have sufficient output factor.

DISCLOSURE OF THE INVENTION

An object of the present invention is to provide an n-type thermoelectric material having high figure of merit and high output factor, a method for producing the same, and a thermoelectric converter.

The present inventors have achieved the present invention as a result of their dedicated study.

That is, the present invention provides the following <1> to <8.>.

<1> A thermoelectric material comprising an oxide containing Ti, M, and O, and the oxide is represented by Formula (1).

$$Ti_{1-x}M_xO_y \qquad (1)$$

In Formula (1), M represents at least one selected from the group consisting of V, Nb, and Ta, x is not less than 0.05 and not more than 0.5, and y is not less than 1.90 and not more than 2.02.

<2> The thermoelectric material of <1>, wherein the oxide has a rutile-type crystal structure.

<3> The thermoelectric material of <2>, wherein the oxide has a lattice constant of an a-axis of not less than 0.4590 nm and not more than 0.4730 nm, and the lattice constant of a c-axis of not less than 0.2950 nm and not more than 0.3000 nm.

<4> The thermoelectric material of anyone of <1> to <3>, wherein M represents Nb.

<5> The thermoelectric material of anyone of <1> to <4>, wherein the thermoelectric material is a sintered body and a relative density of the sintered body is not less than 60%.

<6> The thermoelectric material of <5>, wherein at least a part of a surface of the thermoelectric material is coated with an oxygen impermeable film.

<7> A thermoelectric converter comprising the thermoelectric material of any one of <1> to <6>.

<8> A method for producing a thermoelectric material comprising the steps of:

(a) preparing a material for sintering containing Ti, M, and O, in which a molar amount of M relative to a total molar amount of Ti and M is not less than 0.05 and not more than 0.5, and the molar amount of O relative to the total molar amount of Ti and M is not less than 1.90 and not more than 2.02, (b) molding the material for sintering, and sintering the resultant under an inert gas atmosphere at a temperature of not less than 900° C. and not more than 1700° C., and wherein, M represents at least one selected from the group consisting of V, Nb, and Ta.

MODE FOR CARRYING OUT THE INVENTION

Thermoelectric Material

Figure 1:
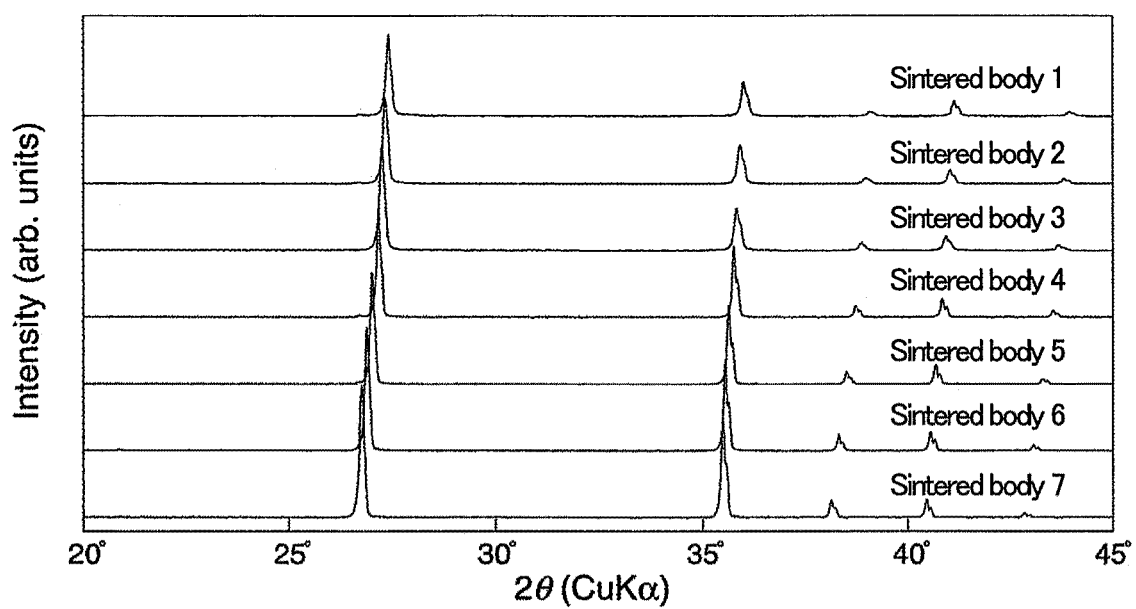
FIG. 1 shows X-ray diffraction patterns of sintered bodies 1 to 7.
Figure 2:
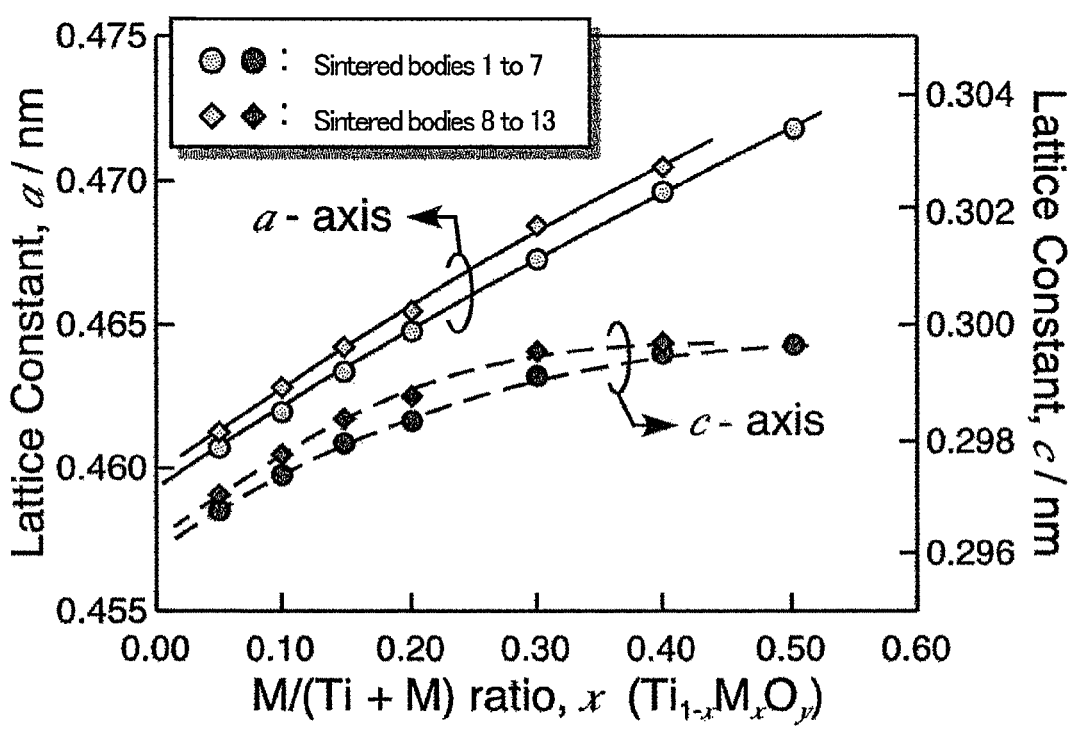
FIG. 2 shows a relation between lattice constants (a-axis, c-axis) and a molar ratio x of each of thermoelectric materials of sintered bodies 1 to 13.
Figure 3:
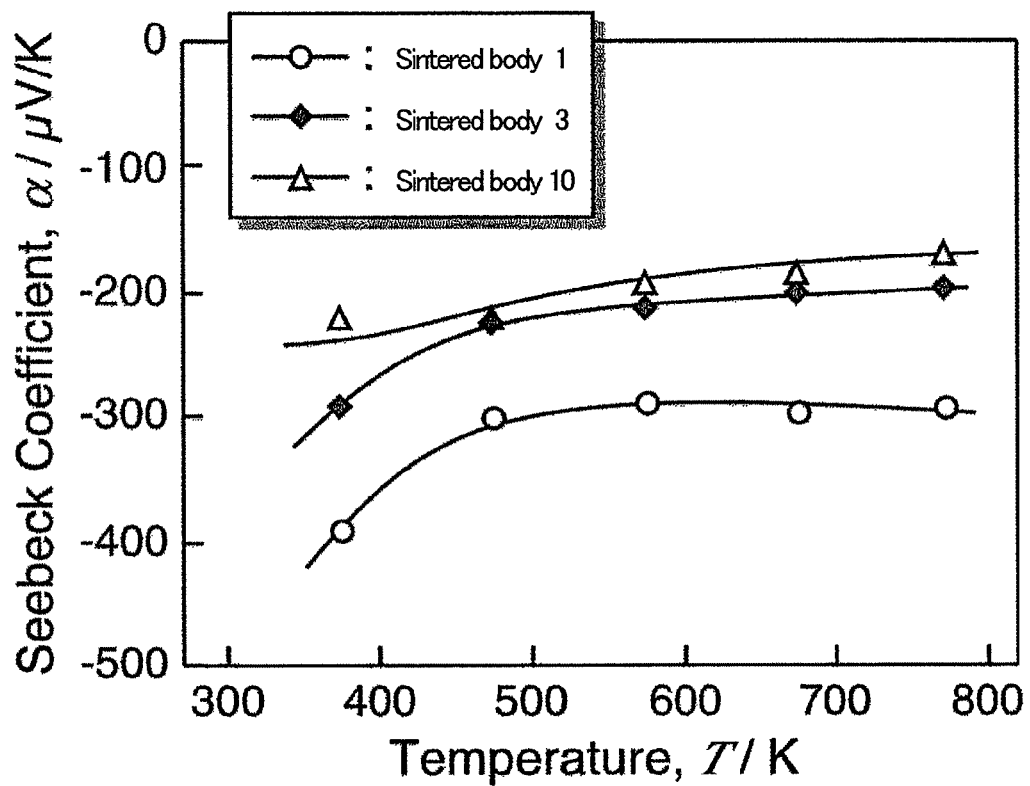
FIG. 3 shows a temperature dependence of Seebeck coefficient in each of the sintered bodies 1, 3, and 10.
Figure 4:
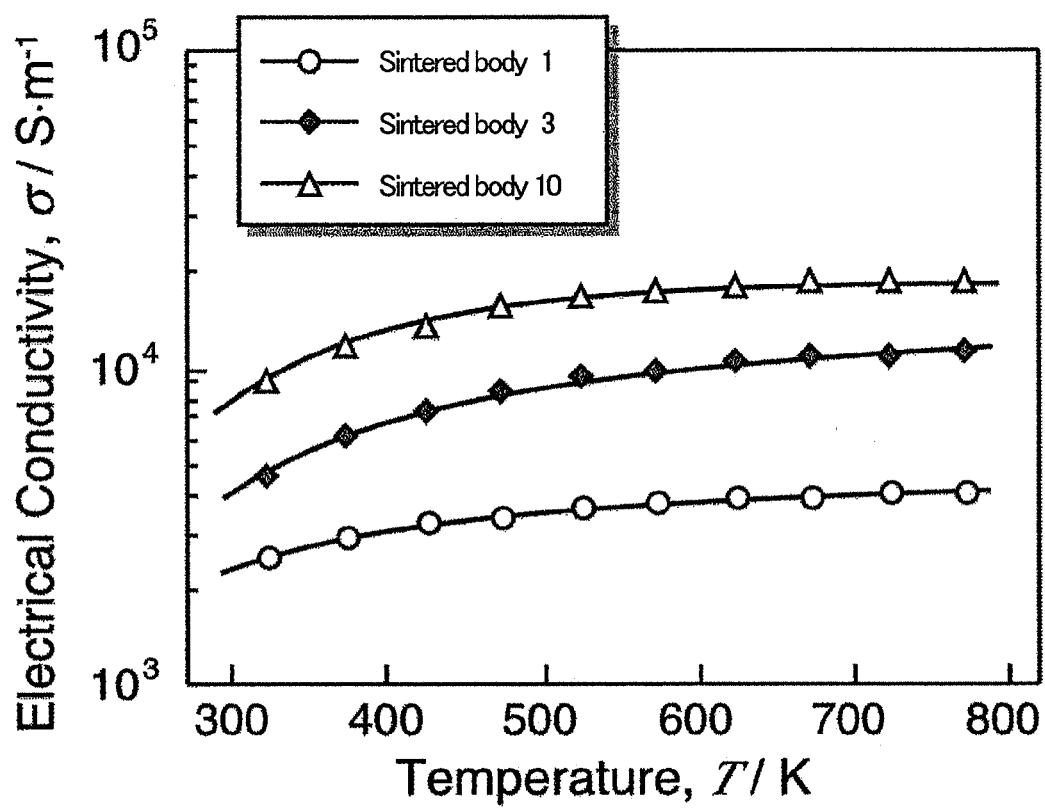
FIG. 4 shows the temperature dependence of electric conductivity in each of the sintered bodies 1, 3, and 10.
Figure 5:
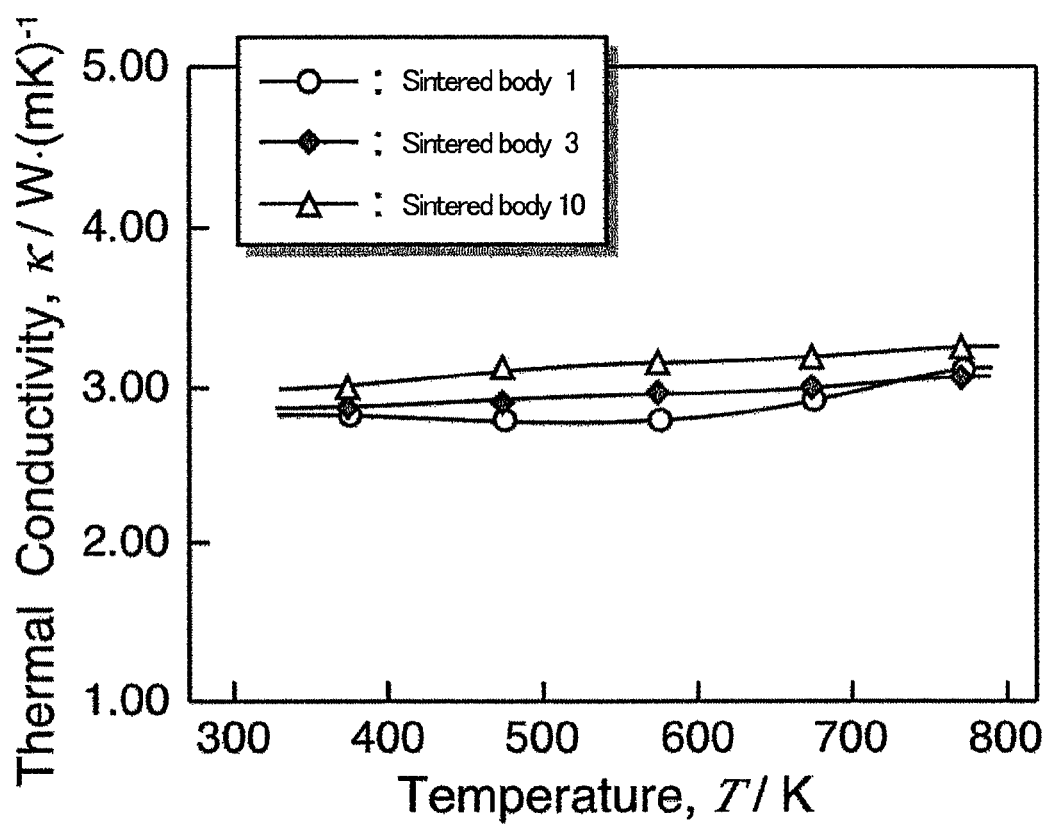
FIG. 5 shows the temperature dependence of thermal conductivity in each of the sintered bodies 1, 3, and 10.
Figure 6:
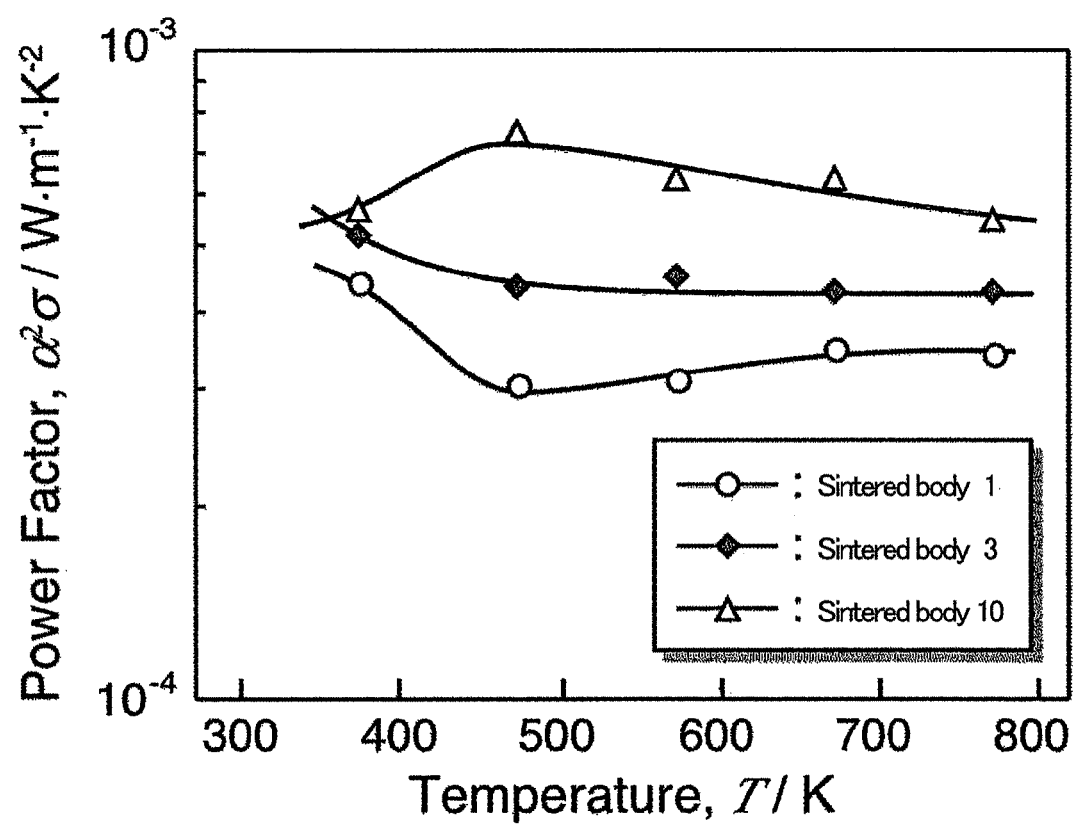
FIG. 6 shows the temperature dependence of output factor in each of Examples 1, 3, and 10.
Figure 7:
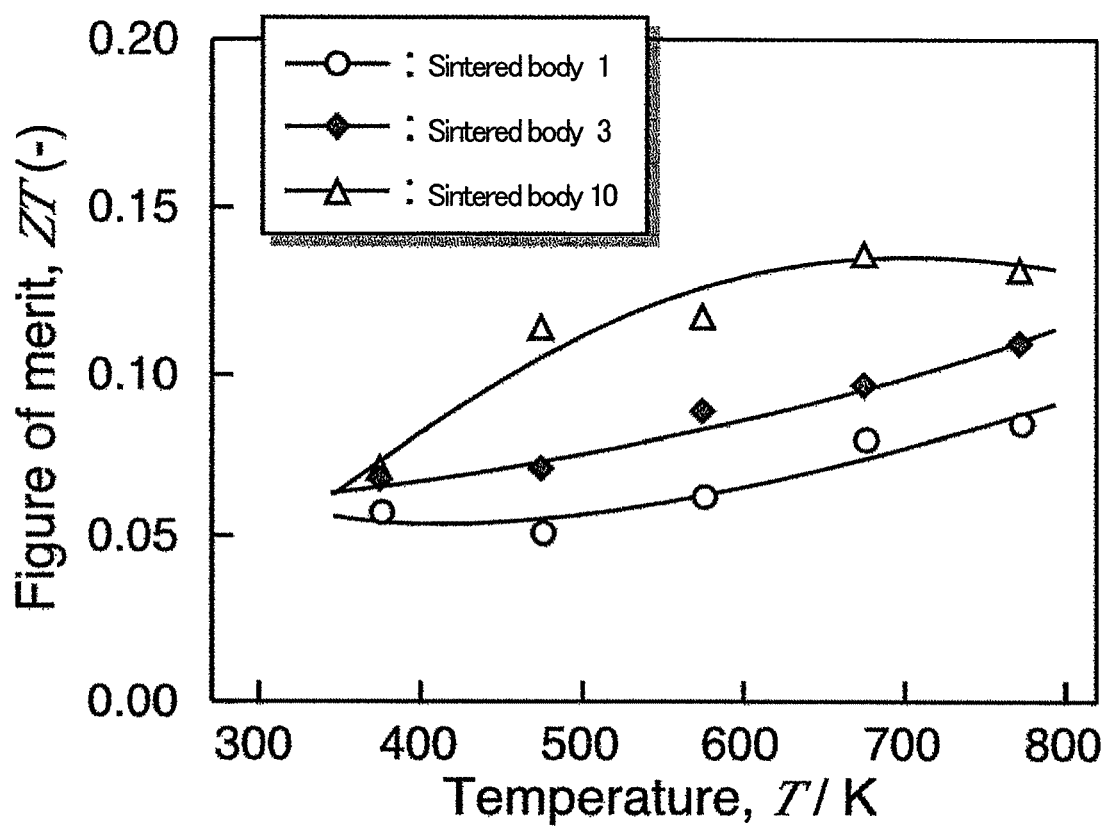
FIG. 7 shows the temperature dependence of dimensionless figure of merit in each of Examples 1, 3, and 10.

A thermoelectric material according to the present invention comprises an oxide containing titanium (Ti), M, and oxygen (O). Examples of M includes vanadium (V), niobium (Nb), and tantalum (Ta). They may be used singly or in combination.

The oxide is represented by Formula (I) described above. In Formula (1), x is not less than 0.05 and not more than 0.5. In viewpoint of increase in output factor, x is preferably not less than 0.05 and not more than 0.20. When x is less than 0.05, the electric conductivity of the thermoelectric material tends to be reduced so that a sufficient value of output factor is not obtained. When x is more than 0.5, its Seebeck coefficient tends to be reduced.

y is not less than 1.90 and not more than 2.02. In viewpoint of an increase in output factor, y is preferably not less than 1.93 and not more than 2.01. When y is less than 1.90, an impurity crystal phase $Ti_nO_{2n-1}$ is formed and the Seebeck coefficient of the thermoelectric material tends to be reduced so that the sufficient value of output factor is not obtained. When y is more than 2.02, the impurity crystal phase (for example, $TiNb_2O_5$, $Nb_2O_5$ or the like when M represents Nb) is formed and its electric conductivity tends to be reduced so that the sufficient value of output factor is not obtained.

In viewpoint of further increase in output factor, when y is not less than 1.99 and not more than 2.01, x is more preferably not less than 0.10 and not more than 0.15. When y is not less than 1.96 and less than 1.99, x is more preferably not less than 0.15 and not more than 0.20.

The oxide has rutile-type, anatase-type, or brookite-type crystal structure, and preferably has rutile-type crystal structure. When the oxide has rutile-type crystal structure, the thermoelectric converter is provided which has excellent energy conversion efficiency even during use at high temperatures and is resistant to degradation due to prolonged use.

When the oxide has rutile-type crystal structure, a lattice constant of an a-axis is not less than 0.4590 nm and not more than 0.4730 nm, preferably not less than 0.4600 nm and not more than 0.4660 nm, and a lattice constant of a c-axis is not less than 0.2950 nm and not more than 0.3000 nm, preferably not less than 0.2960 nm and not more than 0.2990 nm. When the oxide has the lattice constants of the a-axis and the c-axis within the ranges described above, the output factor of the thermoelectric material is further increased. The lattice constant may be calculated by identifying a peak of rutile-type crystal structure in an X-ray diffraction pattern obtained by X-ray diffraction, and using a least squares method from a value at the peak position (2θ) (see, e.g., "Crystal analysis: universal program system (II)" The crystallographic Society of Japan edition: T. Sakurai (1967)).

In viewpoint of further increase in output factor, M preferably includes Nb and more preferably, M is Nb alone.

The thermoelectric material is in the form of, e.g., powder, sintered body, or thin film, and preferably in the form of sintered body. When the thermoelectric material is in the form of sintered body, the shape thereof may be any shape as long as it is an appropriate shape as the thermoelectric converter, and examples of the shape include plate, cylinder, disk, and prism.

The thermoelectric material preferably has high orientation in viewpoint of an increase in electric conductivity. Examples of the form having high orientation include oriented sintered body, single crystal.

The thermoelectric material described above is the n-type thermoelectric material with high output factor, and the thermoelectric converter with high figure of merit is provided by combination with the p-type thermoelectric material.

Method for Producing Thermoelectric Material

The thermoelectric material may be produced by, e.g., a method molding a material which can be converted into a thermoelectric material by sintering, and sintering the resultant. For example, the thermoelectric material may be produced by the method comprising the steps of (a) and (b) described above.

In the step (a), by weighing and mixing a Ti-containing substance and an M-containing substance so as to provide a predetermined composition, a material used in the next step (b) may be prepared. When the thermoelectric material represented by Formula (1) described above is prepared in which x is not less than 0.05 and not more than 0.5, and y is not less than 1.90, preferably not less than 1.93, and not more than 2.02, preferably not more than 2.01, the Ti-containing substance and the M-containing substance may be weighed and mixed so as to satisfy Ti:M=0.95 to 0.5:0.05 to 0.5. When the thermoelectric material represented by Formula (1) described above is prepared in which x is not less than 0.05 and not more than 0.2, and y is not less than 1.90, preferably not less than 1.93, and not more than 2.02, preferably not more than 2.01, the Ti-containing substance and the M-containing substance may be weighed and mixed so as to satisfy Ti:M=0.95 to 0.8:0.05 to 0.2. In the preparation of the thermoelectric material comprising the oxide represented by Formula $Ti_{0.85}Nb_{0.15}O_{2.00}$, for example, $TiO_2$, Ti, and $Nb_2O_5$ may be weighed and mixed so as to provide a molar ratio of Ti:Nb:O satisfying 0.85:0.15:2.00.

Examples of the Ti-containing substance include Ti, and titanium oxides such as $TiO_2$, $Ti_2O_3$, TiO. The titanium-containing substance is usually a combination of at least two of them, and preferably a combination of $TiO_2$ and Ti.

Examples of the M-containing substance include Nb, niobium oxides such as $Nb_2O_5$, Ta, tantalum oxides such as $Ta_2O_5$, V, and vanadium oxides such as $V_2O_5$. The M-containing substance is usually at least one of them, and is preferably the oxide.

Mixing may be performed under either dry or wet condition. The mixing may be performed by using, e.g., ball mill, V-shape mixer, vibration mill, Attritor, Dyno mill, or Dynamic mill. The obtained mixture may be molded.

Furthermore, the mixture may be calcined. For example, when the molar amount of O relative to the total molar amount of Ti and M in the mixture is more than 2.02, the mixture may be used as the material by calcining the mixture under an atmosphere of a reducing gas to adjust the molar ratio. On the other hand, when the molar ratio is less than 1.90, the mixture may be used as the material by calcining the mixture under the atmosphere of an oxidizing gas to adjust the molar ratio. In addition, deformation of a sintered body during the sintering described later may be restrained by calcining the mixture with the molar ratio of not less than 1.90 and not more than 2.02 under the atmosphere of an inert gas. When the calcination is performed under the atmosphere of the inert gas, calcination conditions depend on the composition of the mixture, and calcination time is, e.g., 0.5 to 24 hours. The calcined mixture may be milled. The milling may be performed using, e.g., ball mill, vibration mill, Attritor, Dyno mill, Dynamic mill, and the like.

In the step (b), the material is molded and sintered as described above.

Molding may be performed by, e.g., uniaxial pressing, cold isostatic pressing (CIP), mechanical pressing, hot pressing, or hot isostatic pressing (HIP). The molding may be appropriately selected in accordance with the shape of the thermoelectric converter. Examples of the shape include plate, cylinder, disk, and prism. In the molding, a binder, a dispersant, a lubricant, or the like may be added to the material.

The sintering is performed under an inert atmosphere. Examples of the inert gas include nitrogen-containing gas and rare gas-containing gas, and preferably rare gas-containing gas, more preferably the rare gas alone. The rare gas is preferably argon (Ar) in viewpoint of operability. A sintering temperature is not less than 900° C. and not more than 1700° C., preferably not less than 1200° C. and not more than 1500° C., more preferably not less than 1250° C. and not more than 1450° C. When the sintering temperature is less than 900° C., solid phase reaction and the sintering do not sufficiently proceed, and the electric conductivity may decrease depending on the composition. When the sintering temperature is more than 1700° C., a target oxide is not obtained due to elution or vaporization of constituent elements depending on the composition, and the figure of merit of the thermoelectric material is lowered. The sintering time is usually about 0.5 to 24 hours.

In the step (b), the molding and the sintering of the material may be simultaneously performed. In this case, as an apparatus, a hot pressing apparatus or a hot isostatic pressing (HIP) apparatus may be used.

The obtained sintered body has a sintered density of usually not less than 60%, preferably not less than 80%, more preferably not less than 85% in viewpoint of an improvement in the strength of the sintered body. The thermoelectric material comprising a sintered body with high density has a high electric conductivity. The density of the sintered body may be adjusted with, e.g., a particle size of the material, molding pressure, the sintering temperature, and the sintering time.

The sintered body may further milled, and sintered under the conditions described above. The surface of the sintered body may be coated with an oxygen impermeable film. The oxygen impermeable film may be any film as long as it does not allow oxygen to permeate therethrough or makes it difficult for oxygen to permeate therethrough, and is composed of, e.g., alumina, titania, zirconia, silica, or silicon carbide. The coating may be performed by aerosol deposition, thermal spraying, or CVD. In the thermoelectric material composed of such a coated sintered body, surface oxidation is restrained and its performance is not easily lowered even when it is used under the oxidizing atmosphere.

In addition to the method described above, the thermoelectric material may be produced by a method comprising a coprecipitation step, a method comprising a hydrothermal step, a method comprising a drying-up step, a method comprising a sputtering step, a method comprising a step by CVD, a method comprising a sol-gel step, a method comprising a FZ (floating zone melting method) step, and a method comprising a TSCG (template-type single crystal growth method) step.

Thermoelectric Converter

A thermoelectric converter according to the present invention has the n-type thermoelectric material described above, and usually has the n-type thermoelectric material, a p-type thermoelectric material, an n-electrode, and a p-electrode. Examples of the p-type thermoelectric material include $NaCo_2O_4$ and $Ca_3Co_4O_9$ (JP-A-9-321346, JP-A-2001-64021). The p-type thermoelectric material is commercially available. The thermoelectric converter may be produced by a conventional method (for example, JP-A-5-315657).

EXAMPLES

The present invention will be illustrate in detail in accordance with examples. Properties of the thermoelectric material were measured by the following methods.

1. Electric Conductivity ($\sigma$)

A sintered body sample was worked into the shape of prism, a platinum wire was attached to the sample with a silver paste, and the sample was analyzed by a DC four-terminal method. The analysis was performed in a nitrogen gas flow while the temperature was varied in the range from room temperature to 500° C.

2. Seebeck Coefficient ($\alpha$)

The temperatures and the thermoelectromotive force of a sintered body sample were measured by attaching R-type thermocouples and the platinum wires with the silver paste at both ends of the sintered body sample which was worked into the same shape as that in the measurement of the electric conductivity. The measurement was performed in the nitrogen gas flow while the temperature was varied in the range from room temperature to 500° C. One surface of the sintered body sample was cooled by a cooling tube to be a low-temperature portion, the temperatures of the both ends of the sintered body sample were measured with the R-type thermocouples, and, at the same time, the thermoelectromotive force ($\Delta V$) generated between the both end surfaces of the sintered body sample was also measured. A temperature difference ($\Delta T$) between the both ends of the sintered body sample was adjusted in the range from 0.5 to 10° C., and the Seebeck coefficient ($\alpha$) was calculated from a gradient of $\Delta T$ and $\Delta V$.

3. Thermal Conductivity ($\kappa$)

The measurement of specific heat and thermal diffusivity of the sintered body sample was performed in a vacuum by a laser flash method while the temperature was varied in the range from room temperature to 500° C. For the measurement, the laser flash method thermal conductivity measurement apparatus Model TC-7000 manufactured by Shinku Riko K.K. was used.

4. Structure and Composition Analysis

Crystal structures of a powder sample and a sintered body sample were identified using the X-ray diffractometer Model RINT2500TTR manufactured by Rigaku Corporation by powder X-ray diffraction with CuK$\alpha$ as a radiation source. The lattice constants (a-axis, c-axis) of the rutile-type crystal structures of the samples were calculated by identifying peaks by the rutile-type crystal structures using X-ray diffraction patterns, and using a least squares method from values at the peak positions ($2\theta$). The compositions of metal elements of the samples were determined by using PW1480 X-ray fluorescence spectrometer manufactured by Philips Co. The amounts of O contained in the samples were calculated by considering, as the increased amount of O, the total increase in weight when heat treatment was performed with respect to the samples in an air for 48 hours at temperatures not less than 1000° C. and not more than 1200° C. (the heat treatment was performed at 1000° C. when Ta was used as the starting material and was performed at 1200° C. when Nb was used as the starting material).

5. Density of Sintered Body

A real density of the sintered body sample was measured by Archimedes method and a relative density was calculated based on the real density and data on the lattice constants obtained by powder X-ray diffraction.

Example 1

Preparation of Material for Sintering

As the starting materials, titanium oxide ($TiO_2$, trade name: PT-401M, manufactured by ISHIHARA TECHNO CORPORATION), metal titanium (Ti, manufactured by Kojundo Chemical Laboratory Co., Ltd.), and niobium oxide. ($Nb_2O_5$, manufactured by Kojundo Chemical Laboratory Co., Ltd.) were used. As shown in Table 1, these materials were weighed so as to satisfy $TiO_2:Ti:Nb_2O_5=0.9375:0.0025:0.0250$, and mixed with a dry ball mill (media: plastic ball) for 6 hours to obtain a mixture satisfying $Ti:Nb:O=0.95:0.05:2.00$.

[Molding, Sintering]

The mixture was molded by uniaxial pressing (molding pressure: 200 kg/cm$^2$) and the obtained disk-like molded body was calcined under an argon gas atmosphere (Ar purity: 99.9995%) at 1000° C. for 3 hours. The obtained calcined body was dry-milled with a ball mill (media: ball made of zirconia). The obtained milled product was molded by uniaxial pressing (molding pressure: 200 kg/cm$^2$) and further molded by the isostatic pressing (molding pressure: 1500 kg/cm$^2$). The obtained disk-like molded body was placed in a sintering furnace, and sintered under an argon gas atmosphere (Ar purity: 99.9995%) at 1300° C. for 12 hours to obtain a sintered body 1.

The sintered body 1 had a black outer appearance and a relative density of 82.3%. The sintered body 1 had a rutile-type crystal structure and a lattice constant of a-axis of 0.4680 nm, a lattice constant of c-axis of 0.2968 nm. The composition, the lattice constants, and the relative density of the sintered body 1 were shown in Table 2.

With regard to the sintered body 1(thermoelectric material), a Seebeck coefficient ($\alpha$), an electric conductivity ($\sigma$), a thermal conductivity ($\kappa$), an output factor ($\alpha^2 \times \sigma$), a dimensionless figure of merit (ZT) at 500° C. were measured, and the results of the measurement were shown in Table 3. The dimensionless figure of merit is a value obtained by multiplying the figure of merit (Z, unit: $K^{-1}$) by absolute temperature (T, unit: K).

Examples 2 to 13

Examples 2 to 13 Correspond to Production Examples of Sintered Bodies 2 to 13, Respectively The starting materials and used amounts thereof in the sintered bodies 2 to 13 were shown in Table 1. The sintered bodies 2 to 13 were obtained by performing the same operations as those in [Preparation of material for sintering] and [Molding, Sintering] of Example 1 except that the used amounts of the starting materials were changed. Each of the sintered bodies 2 to 13 had a rutile-type crystal structure. Properties of the sintered bodies 2 to 13 were shown in Tables 2 and 3.

TABLE 1

| | Used amount of starting material | | | | |
|---|---|---|---|---|---|
| | Starting material and its used molar amount | | | $Ti_{1-x}Nb_xO_y$ at the time of weighing | |
| Sintered body | $TiO_2$ | Ti | $Nb_2O_5$ | x | y |
| Sintered body 1 | 0.9375 | 0.0125 | 0.0250 | 0.05 | 2.00 |
| Sintered body 2 | 0.8750 | 0.0250 | 0.0500 | 0.10 | 2.00 |
| Sintered body 3 | 0.8125 | 0.0375 | 0.0750 | 0.15 | 2.00 |
| Sintered body 4 | 0.7500 | 0.0500 | 0.1000 | 0.20 | 2.00 |
| Sintered body 5 | 0.6250 | 0.0750 | 0.1500 | 0.30 | 2.00 |
| Sintered body 6 | 0.5000 | 0.1000 | 0.2000 | 0.40 | 2.00 |
| Sintered body 7 | 0.3750 | 0.1250 | 0.2500 | 0.50 | 2.00 |
| Sintered body 8 | 0.9125 | 0.0375 | 0.0250 | 0.05 | 1.95 |
| Sintered body 9 | 0.8500 | 0.0500 | 0.0500 | 0.10 | 1.95 |
| Sintered body 10 | 0.7875 | 0.0625 | 0.0750 | 0.15 | 1.95 |
| Sintered body 11 | 0.7250 | 0.0750 | 0.1000 | 0.20 | 1.95 |
| Sintered body 12 | 0.6000 | 0.1000 | 0.1500 | 0.30 | 1.95 |
| Sintered body 13 | 0.4750 | 0.1250 | 0.2000 | 0.40 | 1.95 |

TABLE 2

| | Properties of sintered body | | | | |
|---|---|---|---|---|---|
| | Analysis result of composition ($Ti_{1-x}Nb_xO_y$) | | Lattice constant | | Relative |
| Sintered body | x | y | a-axis (nm) | c-axis (nm) | Density (%) |
| Sintered body 1 | 0.05 | 2.01 | 0.4608 | 0.2968 | 82.3 |
| Sintered body 2 | 0.10 | 2.00 | 0.4621 | 0.2975 | 91.5 |
| Sintered body 3 | 0.15 | 1.99 | 0.4634 | 0.2979 | 89.5 |
| Sintered body 4 | 0.20 | 2.01 | 0.4649 | 0.2984 | 94.6 |
| Sintered body 5 | 0.30 | 2.01 | 0.4673 | 0.2991 | 87.6 |
| Sintered body 6 | 0.40 | 2.02 | 0.4696 | 0.2995 | 80.2 |
| Sintered body 7 | 0.50 | 2.02 | 0.4719 | 0.2997 | 78.4 |
| Sintered body 8 | 0.05 | 1.95 | 0.4612 | 0.2971 | 88.6 |
| Sintered body 9 | 0.10 | 1.96 | 0.4627 | 0.2977 | 93.7 |
| Sintered body 10 | 0.15 | 1.97 | 0.4642 | 0.2983 | 91.5 |
| Sintered body 11 | 0.20 | 1.97 | 0.4654 | 0.2988 | 94.2 |
| Sintered body 12 | 0.30 | 1.95 | 0.4684 | 0.2996 | 80.5 |
| Sintered body 13 | 0.40 | 1.96 | 0.4704 | 0.2997 | 72.7 |

TABLE 3

| | Thermoelectric characteristics of sintered body | | | | |
|---|---|---|---|---|---|
| Sintered body | Seebeck coefficient $\alpha(\mu V/K)$ | Electric conductivity $\sigma(S/m)$ | Thermal conductivity $\kappa(W/mK)$ | Output factor $\alpha^2\sigma(W/mK^2)$ | Dimensionless figure of merit ZT(—) |
| Sintered body 1 | −290 | $4.09 \times 10^3$ | 3.10 | $3.43 \times 10^{-4}$ | 0.086 |
| Sintered body 2 | −236 | $7.65 \times 10^3$ | 3.30 | $4.26 \times 10^{-4}$ | 0.097 |
| Sintered body 3 | −196 | $1.12 \times 10^4$ | 3.05 | $4.30 \times 10^{-4}$ | 0.109 |
| Sintered body 4 | −200 | $5.43 \times 10^3$ | 2.59 | $2.17 \times 10^{-4}$ | 0.065 |
| Sintered body 5 | −165 | $5.29 \times 10^3$ | 1.96 | $1.44 \times 10^{-4}$ | 0.057 |
| Sintered body 6 | −143 | $6.15 \times 10^3$ | 1.81 | $1.26 \times 10^{-4}$ | 0.054 |
| Sintered body 7 | −139 | $8.36 \times 10^3$ | 1.98 | $1.62 \times 10^{-4}$ | 0.063 |
| Sintered body 8 | −212 | $9.04 \times 10^3$ | 3.49 | $4.07 \times 10^{-4}$ | 0.090 |
| Sintered body 9 | −152 | $1.43 \times 10^4$ | 3.59 | $3.31 \times 10^{-4}$ | 0.071 |
| Sintered body 10 | −170 | $1.89 \times 10^4$ | 3.24 | $5.47 \times 10^{-4}$ | 0.131 |
| Sintered body 11 | −152 | $2.17 \times 10^4$ | 3.19 | $5.04 \times 10^{-4}$ | 0.122 |
| Sintered body 12 | −120 | $1.80 \times 10^4$ | 2.35 | $2.60 \times 10^{-4}$ | 0.085 |
| Sintered body 13 | −116 | $1.61 \times 10^4$ | 2.09 | $2.18 \times 10^{-4}$ | 0.081 |

Example 14

As the starting materials, titanium oxide ($TiO_2$, PT-401M (product name) manufactured by ISHIHARA TECHNO CORPORATION), metal titanium (Ti, Kojundo Chemical Laboratory Co., Ltd.), and tantalum oxide ($Ta_2O_5$, Kojundo Chemical Laboratory Co., Ltd.) were used. As shown in Table 4, these materials were weighed so as to satisfy $TiO_2$:Ti:$Ta_2O_5$=0.9375:0.0025:0.025, and mixed with the dry ball mill (medium: plastic ball) for 6 hours, whereby a mixture with the molar ratio of Ti:Ta:O satisfying 0.95:0.05:2.00 was obtained.

A sintered body 14 was obtained by performing the same operations as those in [Molding, Sintering] of Example 1 with respect to the mixture. The sintered body 14 was found to have the rutile-type crystal structure. Properties of the sintered body 14 were shown in Tables 5 and 6.

Examples 15 and 16

Examples 15 and 16 Correspond to Production Examples of Sintered Bodies 15 and 16, Respectively The starting materials and used amounts thereof in the sintered bodies 15 and 16 were shown in Table 4. The sintered bodies 15 and 16 were obtained by performing the same operations as those in Example 14 except that the used amounts of the starting materials were changed. Each of the sintered bodies 15 and 16 had a rutile-type crystal structure. Properties of the sintered bodies 15 and 16 were shown in Tables 5 and 6.

TABLE 4

Used amount of starting material

| Sintered body | Starting material and its used molar amount | | | $Ti_{1-x}Nb_xO_y$ at the time of weighing | |
|---|---|---|---|---|---|
| | $TiO_2$ | Ti | $Ta_2O_5$ | x | y |
| Sintered body 14 | 0.9375 | 0.0125 | 0.0250 | 0.05 | 2.00 |
| Sintered body 15 | 0.8750 | 0.0250 | 0.0500 | 0.10 | 2.00 |
| Sintered body 16 | 0.8500 | 0.0500 | 0.0500 | 0.10 | 1.95 |

TABLE 5

Properties of sintered body

| Sintered body | Analysis result of composition ($Ti_{1-x}Ta_xO_y$) | | Lattice constant | | Relative density (%) |
|---|---|---|---|---|---|
| | x | y | a-axis (nm) | c-axis (nm) | |
| Sintered body 14 | 0.05 | 2.00 | 0.4606 | 0.2969 | 92.9 |
| Sintered body 15 | 0.10 | 1.99 | 0.4621 | 0.2977 | 87.0 |
| Sintered body 16 | 0.10 | 1.98 | 0.4627 | 0.2982 | 94.4 |

TABLE 6

Thermoelectric characteristics of sintered body

| Sintered body | Seebeck coefficient $\alpha(\mu V/K)$ | Electric conductivity $\sigma(S/m)$ | Thermal conductivity $\kappa(W/mK)$ | Output factor $\alpha^2\sigma(W/mK^2)$ | Dimensionless figure of merit ZT(—) |
|---|---|---|---|---|---|
| Sintered body 14 | −323 | $2.18 \times 10^3$ | 3.37 | $2.28 \times 10^{-4}$ | 0.052 |
| Sintered body 15 | −228 | $3.68 \times 10^3$ | 2.56 | $1.92 \times 10^{-4}$ | 0.058 |
| Sintered body 16 | −158 | $8.84 \times 10^3$ | 3.15 | $2.21 \times 10^{-4}$ | 0.054 |

Comparative Examples 1 to 3

Comparative Examples 1 to 3 Correspond to Production Examples of Sintered Bodies 17 to 19, Respectively The starting materials and used amounts thereof in the sintered bodies 17 to 19 were shown in Table 7. The sintered bodies 17 to 19 were obtained by performing the same operations as those in [Preparation of material for sintering] and [Molding, Sintering] of Example 1 except that the used amounts of the starting materials were changed. Each of the sintered bodies 17 to 19 had two phases of a rutile-type crystal structure of $TiO_2$ and a crystal structure of $TiNb_2O_7$, and low real density. Properties of the sintered bodies 17 to 19 were shown in Tables 8 and 9.

TABLE 7

| | Used amount of starting material | | | $Ti_{1-x}Nb_xO_y$ at the time of weighing | |
|---|---|---|---|---|---|
| | Starting material and its used molar amount | | | | |
| Sintered body | $TiO_2$ | Ti | $Nb_2O_5$ | x | y |
| Sintered body 17 | 0.9000 | 0 | 0.0500 | 0.10 | 2.05 |
| Sintered body 18 | 0.8500 | 0 | 0.0750 | 0.15 | 2.08 |
| Sintered body 19 | 0.8000 | 0 | 0.1000 | 0.20 | 2.10 |

TABLE 8

| | Properties of sintered body | |
|---|---|---|
| | Analysis result of composition ($Ti_{1-x}Nb_xO_y$) | |
| Sintered body | x | y |
| Sintered body 17 | 0.05 | 2.03 |
| Sintered body 18 | 0.15 | 2.06 |
| Sintered body 19 | 0.20 | 2.08 |

TABLE 9

| | Thermoelectric characteristics of sintered body | | | | |
|---|---|---|---|---|---|
| Sintered body | Seebeck coefficient $\alpha(\mu V/K)$ | Electric conductivity $\sigma(S/m)$ | Thermal conductivity $\kappa(W/mK)$ | Output factor $\alpha^2\sigma(W/mK^2)$ | Dimensionless figure of merit $ZT(-)$ |
| Sintered body 17 | −288 | $1.11 \times 10^3$ | 1.52 | $9.21 \times 10^{-5}$ | 0.047 |
| Sintered body 18 | −500 | $3.78 \times 10^2$ | 1.97 | $9.44 \times 10^{-5}$ | 0.037 |
| Sintered body 19 | −349 | $1.82 \times 10^2$ | 2.18 | $2.22 \times 10^{-5}$ | 0.008 |

INDUSTRIAL APPLICABILITY

An n-type thermoelectric material according to the present invention is high in figure of merit and output factor, and is useful for a thermoelectric converter with high energy conversion efficiency and a large output per unit temperature.

The invention claimed is:

1. A thermoelectric material comprising an oxide containing Ti, M, and O, wherein the oxide is represented by Formula (1):

$$Ti_{1-x}M_xO_y \qquad (1),$$

wherein M represents at least one selected from the group consisting of V, Nb, and Ta, x is not less than 0.05 and not more than 0.5, and y is not less than 1.90 and not more than 2.02, wherein the oxide has a rutile-type crystal structure and a lattice constant of an a-axis of not less than 0.4600 nm and not more than 0.4660 nm and a lattice constant of a c-axis of not less than 0.2960 nm and not more than 0.2990 nm.

2. The thermoelectric material of claim 1, wherein M represents Nb.

3. The thermoelectric material of claim 1, wherein the thermoelectric material is a sintered body and a relative density of the sintered body is not less than 60%.

4. The thermoelectric material of claim 3, wherein at least a part of a surface of the thermoelectric material is coated with an oxygen impermeable film.

5. A thermoelectric converter comprising the thermoelectric material of claim 1.

* * * * *